United States Patent [19]
Merlo

[11] Patent Number: 5,073,078
[45] Date of Patent: Dec. 17, 1991

[54] AUTOMATIC INTELLIGENT MAGAZINE FOR ELECTRONIC COMPONENTS

[76] Inventor: Vincenzo Merlo, Via Bellini 28, 22020 Lainate, Italy

[21] Appl. No.: 517,253

[22] Filed: May 1, 1990

[30] Foreign Application Priority Data

May 4, 1989 [IT] Italy .............................. 20372 A/89

[51] Int. Cl.[5] .............................................. B65G 1/00
[52] U.S. Cl. ................................... 414/274; 221/14; 414/403; 414/276; 235/385; 29/809
[58] Field of Search ............... 414/273, 274, 275, 222, 414/403, 414, 416, 417, 795.8, 795.4, 276; 221/6, 14, 281; 29/741, 759, 809; 235/385

[56] References Cited

U.S. PATENT DOCUMENTS

| | | | |
|---|---|---|---|
| 3,247,929 | 4/1966 | Langley | 414/276 X |
| 4,278,182 | 7/1981 | Ahlström | 221/14 X |
| 4,560,314 | 12/1985 | Fohler | 414/276 |
| 4,636,634 | 1/1987 | Harper et al. | 414/274 X |
| 4,761,106 | 8/1988 | Brown et al. | 414/403 X |
| 4,763,811 | 8/1988 | Mae et al. | 414/403 X |
| 4,913,612 | 4/1990 | Asazuma et al. | 414/403 |

FOREIGN PATENT DOCUMENTS

155104 7/1986 Japan .................................. 414/274

*Primary Examiner*—Frank E. Werner
*Attorney, Agent, or Firm*—Guido Modiano; Albert Josif

[57] ABSTRACT

The modular magazine for feeding tubular containers for stacks of electronic components to a dispenser rack of a machine for the automatic insertion of such components essentially comprises at least one assembly with containment cells for respective tubular containers of the components, each cell being defined by an elongated compartment closed at least at one end by an oscillable lid element, a plurality of sensor elements, each of which is associable with a preset respective portion of the rack to indicate the depletion of components in at least one of the containers in the rack, and electronic control circuit elements driven by the sensor elements to indicate the depletion of the components in the at least one container and to actuate the opening oscillation of the oscillable lid of that cell among the assembly of cells which accommodates tubular containers which contain components of the kind of the depleted ones.

8 Claims, 3 Drawing Sheets

AUTOMATIC INTELLIGENT MAGAZINE FOR ELECTRONIC COMPONENTS

BACKGROUND OF THE INVENTION

The present invention relates to an automatic magazine or store for electronic components, in particular for automatic insertion of integrated circuits on boards, panels and/or the like.

As is known, automatic machines are currently commercially available for inserting, on boards and/or panels, integrated circuits generally constituted by blocks for example of parallelepipedal shape from which a plurality of connecting pins protrudes.

Said integrated circuits in particular are usually contained in a stacked arrangement in elongated tubular containment bodies from which each integrated circuit is caused to exit by gravity, in succession, starting from the lowermost integrated circuit of the stack, for appropriate placement on the circuit boards and/or panels.

For this purpose, insertion machines comprise a rack on which the various container tubes or "packs" of integrated circuits to be mounted are loaded; loading of said packs is performed manually by an operator who must also periodically replace progressively depleting packs with full ones. In order to do so, the operator, before he takes the individual packs from a previously loaded magazine, must check the correct removal position and must then place each individual pack on the rack, carefully checking the loading position. In this operation the empty pack must be replaced with great speed in order to prevent unwanted machine stops which would negatively affect the productive efficiency of said machine.

It is thus evident that consequently the operator is subjected to a very demanding and tiring work due to the constant attention for searching for the empty pack, the identification whereof currently depends on said operator's experience.

Furthermore the operator, even if he has great experience, often makes mistakes in removing the full packs, removing for example an adjacent pack instead of the correct one, or mistakes in the placement of a full pack on the rack, with consequent mistakes in the manufacture of the boards, which will necessarily have to be rejected.

SUMMARY OF THE INVENTION

In view of the above described disadvantages of known integrated circuit insertion machines, the aim of the present invention is to provide an automatic magazine of the intelligent type for feeding integrated circuits contained in tubular packs to inserting machines, which is structured and specifically designed to facilitate the operator in the operation of identifying the empty packs and is at the same time capable of preventing the operator from making mistakes in the removal and/or placement of full packs in replacement of said empty packs.

Within the scope of this aim, a main object of the present invention is to provide a magazine of the indicated type which includes electronic logic means adapted to perform a continuous sequential search or scan of all the packs contained in a rack associated with an inserting machine so as to indicate the position of the empty pack to the operator and offer the operator a full pack the integrated circuits whereof correspond exactly to those previously contained in the indicated empty pack.

Another object of the present invention is to provide a magazine of the indicated type the logic circuit means whereof are also adapted to indicate a possible loading of a full pack in an incorrect position, so as to prevent the operator from performing the loading incorrectly.

Another object of the present invention is to provide a magazine of the indicated type which considerably reduces the operational fatigue of the operator and at the same time is such as to markedly improve the per-hour productivity of the inserting machine.

Another object of the present invention is to provide a magazine of the indicated type which has a modular structure, i.e. is easily expandable, and can be easily adapted to a wide range of currently commercially available inserting machines.

Still another object of the present invention is to provide a magazine of the indicated type which is capable of operating independently of the operation of the inserting machine with which said magazine is to be associated.

Not least object of the present invention is to provide an electronic magazine of the indicated type which is structurally simple, extremely reliable in operation, requires virtually no maintenance and can be easily manufactured starting from easily commercially available materials and components.

BRIEF DESCRIPTION OF THE DRAWINGS

The features and advantages of the automatic magazine according to the present invention will become apparent hereafter from the following detailed description of a possible embodiment thereof, illustrated only by way of non-limitative example in the accompanying schematic drawings, wherein.

DESCRIPTION OF THE PREFERRED EMBODIMENTS

Figure 1:
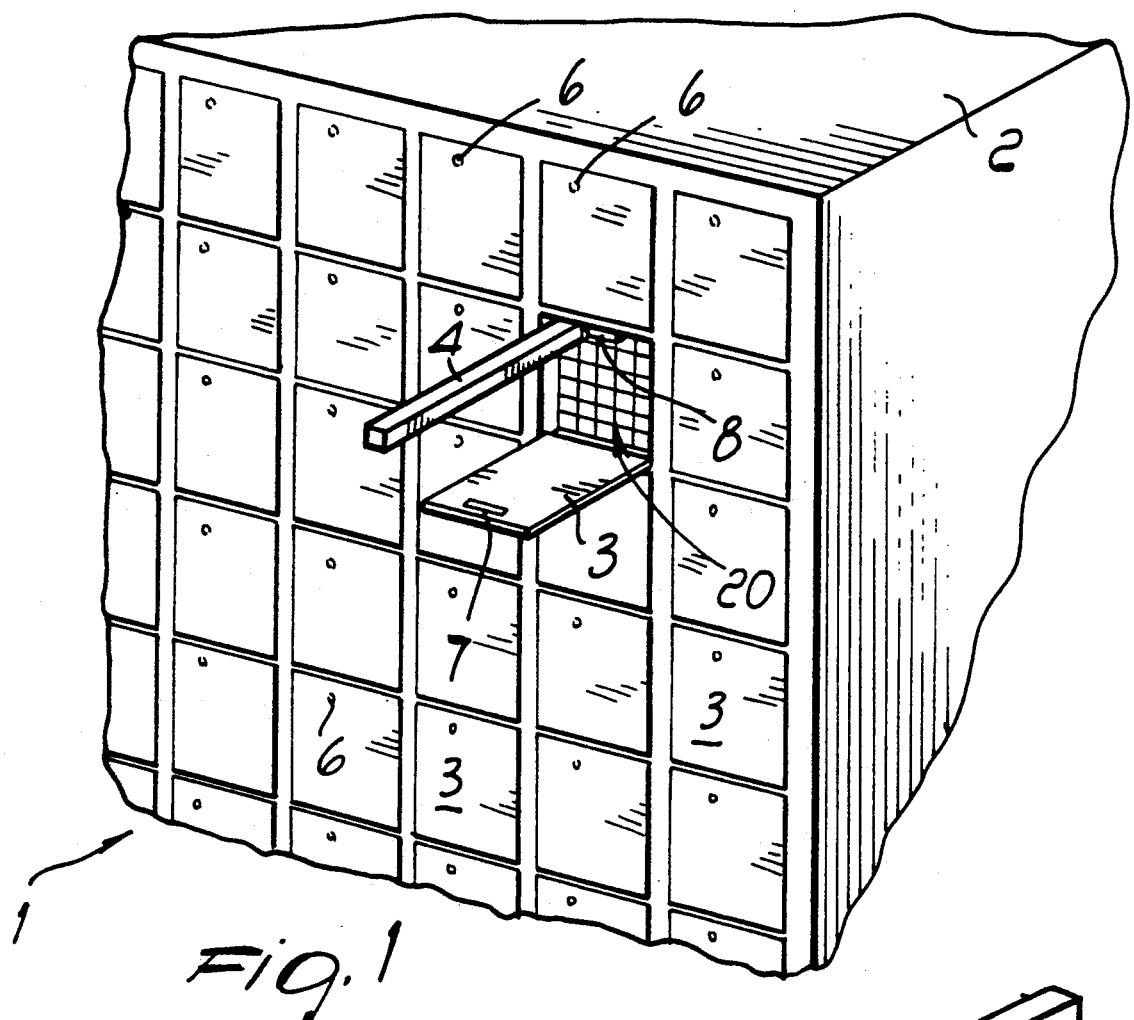
FIG. 1 is a perspective cutout view of a portion of the intelligent automatic magazine according to the present invention.

With reference to the above drawings, FIG. 1 is a partial cutout perspective view of the automatic modular magazine for feeding tubular containers which contain respective stacks of integrated circuits to a rack of an automatic machine (not illustrated) for the insertion of integrated circuits, said magazine being generally indicated by the reference numeral 1.

As can be seen, the magazine 1 comprises a cabinet 2, inside which a plurality of cells 20 is defined and arranged preferably according to a rectangular or square matrix.

Each cell is defined by a compartment, for example with a substantially rectangular or square cross section, which has at least one open end which can be closed by a respective lid 3 which can oscillate to open and close.

Figure 2:
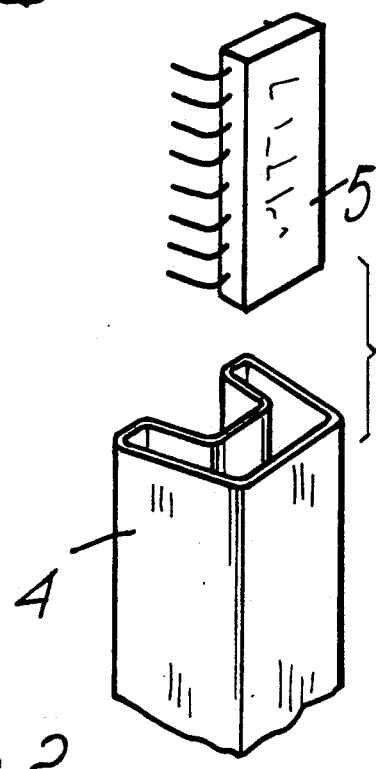
FIG. 2 is a partially cutout exploded perspective view of a pack which contains exemplifying integrated circuits.

Each cell 20 accommodates a plurality of packs 4 which contain integrated circuits 5 for example of the dual-in-line type illustrated merely by way of example in FIG. 2.

Figure 3:
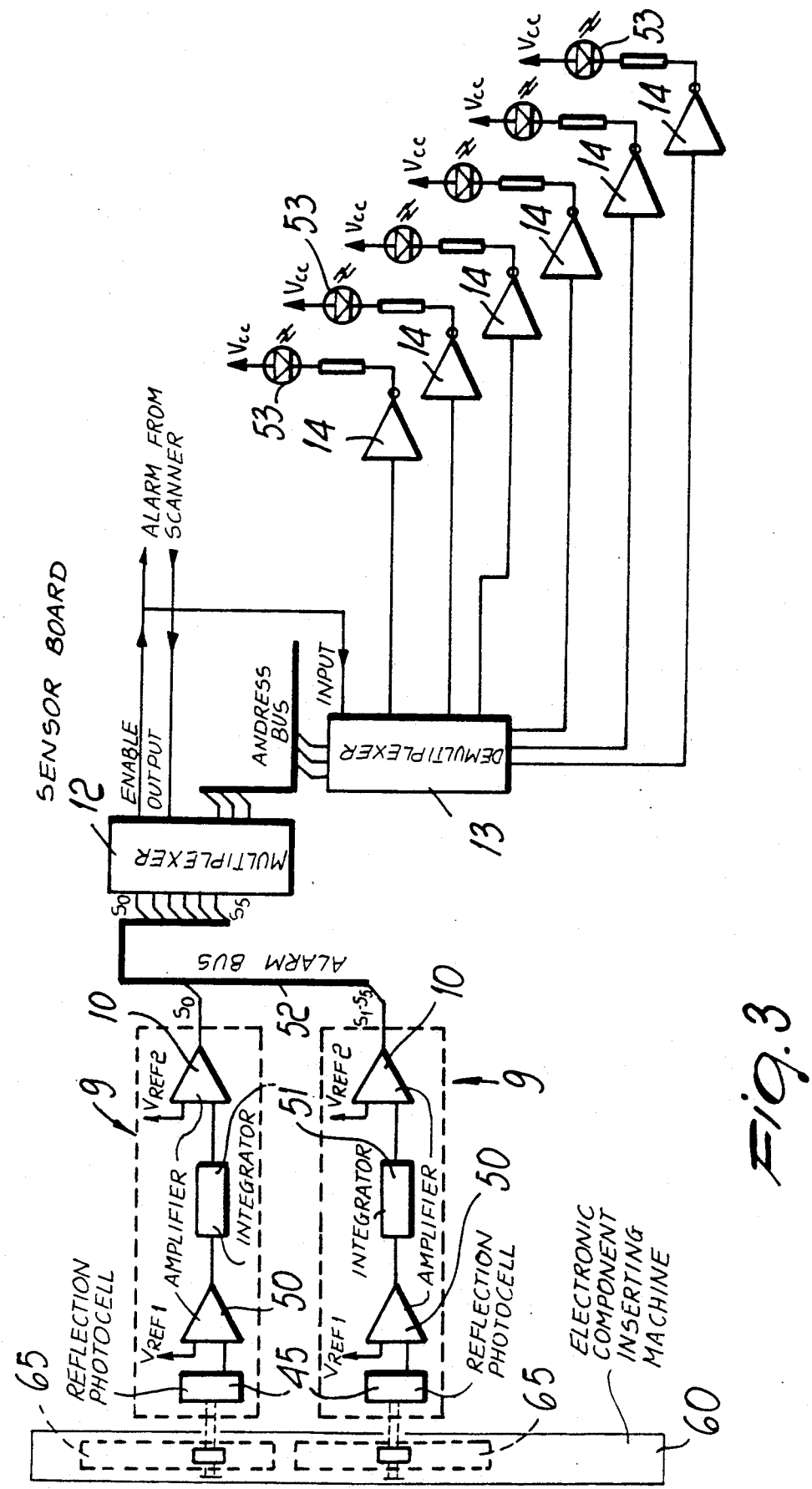
FIG. 3 is a general circuit block diagram of a possible embodiment of a sensor board included in the intelligent logic means associated with the magazine according to the present invention.

Each cell, in particular, comprises a respective type of like packs, i.e. packs which contain different types of integrated circuits which must be automatically mounted on boards and/or panels by said inserting machine (indicated only schematically at 60 in FIG. 3).

In said inserting machine, the individual packs of integrated circuits are inserted in a conventional manner side by side in an appropriate rack 65, also shown only schematically in FIG. 3.

When each individual pack of integrated circuits is depleted, the operator must replace it with a new pack 4, full of integrated circuits, to be taken from the corresponding cell.

According to the invention, depletion of a pack in the rack is promptly indicated to the operator by electronic indication and alarm means which are described in greater detail hereinafter, and this occurs in a fully automatic and absolutely error-free manner.

For this purpose, visual indication means, for example light-emitting diodes 6, are associated with each individual cell to blink so as to show the operator the cell from which he must take the related pack. The opening of the lid of the cell 3 occurs automatically under the control of the circuit means which are described hereinafter.

In particular, said circuit means have been designed specifically to perform the functions of component presence sensing, signal processing, data sending, data processing, peripheral element control, checking successful execution of commands, checking restoring of an initial operating condition and emission of acoustic and visual signals.

Figure 5:
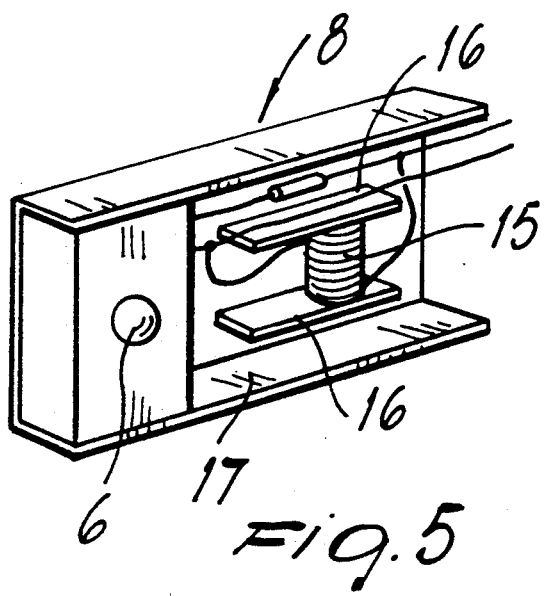
FIG. 5 is a partial perspective view of a possible embodiment of a magnet element which can be associated with each individual cell of the magazine according to the invention in order to open the lid thereof under the control of the electronic circuit means of FIGS. 3 and 4.

Vice versa, the electromechanical part has been specifically designed to execute the commands sent by the electronic part, and is constituted, by way of example, by electromagnets of the type illustrated in FIG. 5, by permanent magnets and by proximity switches.

Each permanent magnet, indicated in particular by the reference numeral 7, is provided so as to be rigidly associated with each lid of each cell so as to be excited in repulsion by a respective electromagnet element which is generally indicated by the numeral 8 in FIG. 5 and is described in greater detail hereinafter.

With reference now to FIG. 3, said figure illustrates a sensor board included in electronic logic means for controlling the intelligent magazine according to the invention.

As can be seen, said sensor board comprises at least one module 9 which comprises, cascade-coupled to each other, a respective conventional reflection photocell 45, amplifier means 50 (receiving a reference voltage $V_{REF1}$), integrator means 51 and further amplifier means 10 (also receiving a further reference voltage $V_{REF2}$). The output of said further amplifier means 10 drives an alarm bus 52 which is circuitally connected to multiplexing means 12 which are in turn circuitally and operatively connected to demultiplexing means 13. The demultiplexing means 13, by means of respective driver circuits 14, drive a plurality of optoelectronic indication means 53 which are also of a known type.

In particular, each reflection photocell must be associated with a respective pack in the rack of the inserting machine.

In this manner each reflection photocell is capable, as is evident to those skilled in the art, of sensing the presence of the integrated circuits in the respective pack and of promptly indicating their depletion so as to excite visual and acoustic depletion indication and/or alarm means.

The sensor board of FIG. 3 drives, according to the invention, an assembly for the control and management of the individual electromagnets for opening the lids of the individual cells, which are arranged in rows and columns.

Figure 4:
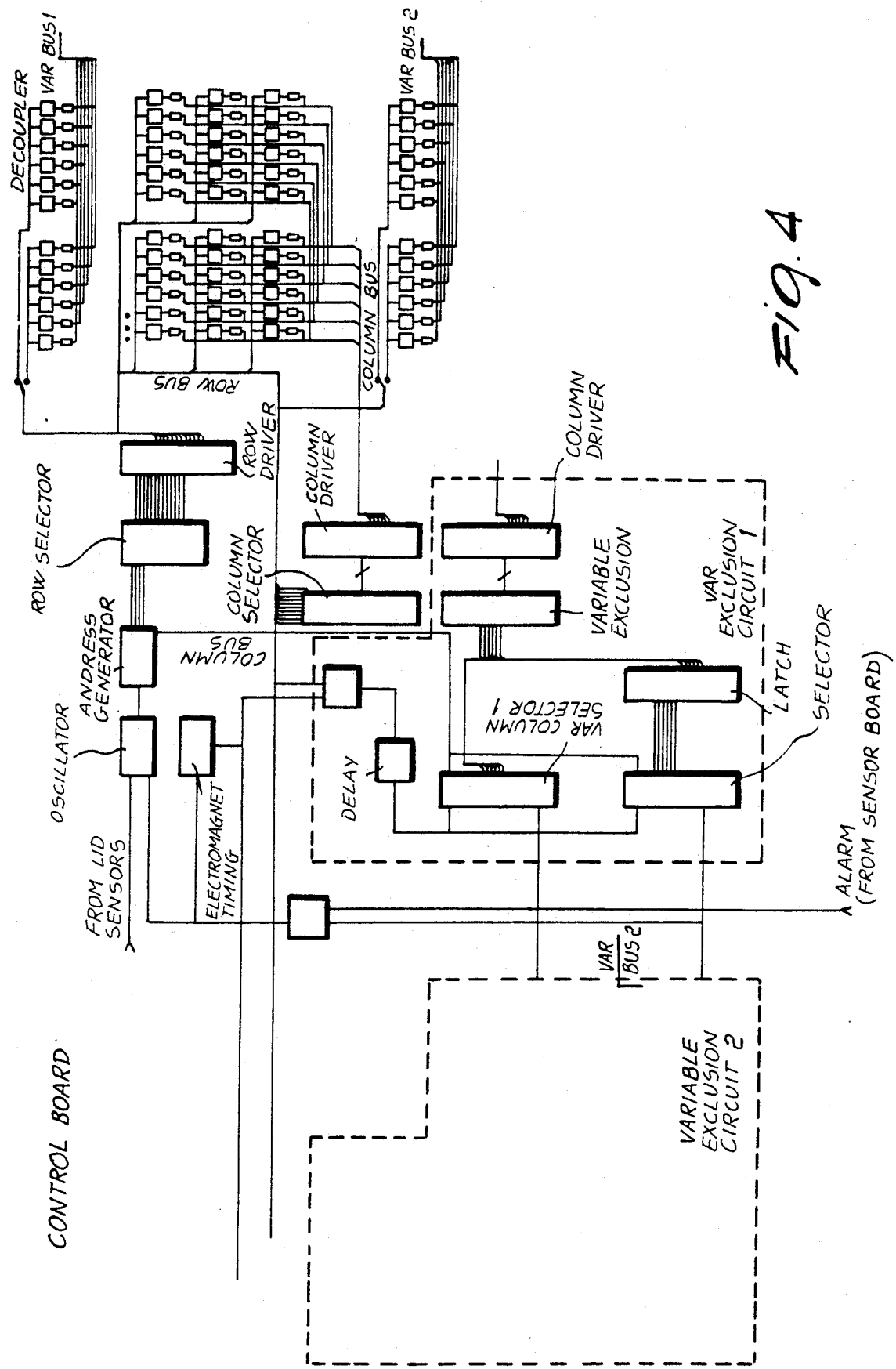
FIG. 4 is a general circuit block diagram of a possible embodiment of a magnet control board associated with the logic control means of the intelligent magazine according to the present invention.

The specific constitution of said control assembly is illustrated in detail in FIG. 4 and is not described specifically in detail since it does not specifically pertain to the invention and would be in any case familiar to the electronics expert.

Suffice it to say that the task of the control assembly is simply to selectively open the lid of the cell which contains full packs of integrated circuits which correspond to the type of which the sensor board has indicated depletion in the rack of the inserting machine.

The lid of said cell open simply by virtue of the action of the magnetic element 8 illustrated in FIG. 5, which as can be seen comprises a substantially column-shaped electric winding 15 supported between two plates or polar end expansions 16 rigidly associated with a box-like profiled body 17 with a substantially U-shaped cross section.

Said box-like body, in particular, should be filled so as to embed the electromagnet therein. As can be seen, the electromagnet 8 is arranged (with reference to FIG. 1) proximate to the lid 3 of each individual cell to repel, when driven by said control assembly, a permanent magnet 7 rigidly associated with each of said lids, and thus open the lid.

From the above description the operation of the intelligent automatic magazine according to the present invention is evident.

In particular, said intelligent automatic magazine performs a continuous sequential search for the empty pack, thus relieving the operator of this task, until, when it finds an empty pack in the rack, it emits a visual signal in the position of the empty pack, for example by means of light-emitting diodes, and an acoustic signal to warn the operator, simultaneously opening the door or lid of the cell in which the packs full of integrated circuits to be taken are located. In this manner, the magazine according to the invention provides a triple indication and the opening of the door involved: the operator must therefore simply extract the integrated circuits from the only open door and cannot thus make mistakes in extraction; the operator subsequently removes the empty pack, being guided in doing so by the visual signal, thus avoiding loading errors, and replaces it with the full one; only in this case does the acoustic signal cease. In particular, if the full pack is accidentally placed in an incorrect position the acoustic signal does not cease.

From the above it can be seen that the invention fully achieves the intended aim and objects.

In particular, an intelligent magazine has been provided which can drastically reduce integrated circuits mounting errors caused by extraction and loading errors. The magazine furthermore causes an increase in the productivity of the inserting machine, since the operator is promptly warned of the depletion of the individual packs and the inserting machine is loaded continuously. At the same time the magazine according to the invention reduces the operative fatigue of the operator, since said operator must simply let himself be guided by the indications without having to engage for hours in a tiring search for the empty pack.

The intelligent magazine according to the invention has naturally been described with reference to an exemplifying embodiment thereof: in this embodiment, the magazine has been provided with 84 cells or locations; however the number of the cells can be easily fitted to contingent requirements.

A particular characteristic of the invention is that the magazine according to the invention has furthermore been designed specifically to be independent of the inserting machine next to which it is to be placed. All the operations related to the automatic magazine can in fact be performed even while the inserting machine is operating. No function or stoppage of the automatic magazine affects the normal operation of the inserting machine. In case of malfunction of the magazine, all or part of its advantages will be lost, but in no case will the speed of insertion of the components, and therefore productivity, be slowed down.

Though the invention has been described with specific reference to a currently preferred embodiment thereof, it is obvious that said embodiment is susceptible to all the modifications and variations which are within the scope of the inventive concept. For example, the described magazine can be easily expanded, since it is of a substantially modular type, and the door of the individual cells may also be closed automatically.

Therefore the invention is not limited to the described embodiment but exclusively by the scope of the inventive concept defined in the accompanying claims.

I claim:

1. An automatic modular magazine having means for feeding tubular containers containing respective stacks of electronic components to a delivery rack of a machine for the automatic insertion of integrated circuits, comprising a plurality of containment cells for tubular containers, said lid being pivotally mounted on an end portion of the magazine that is opposed to the rack end portion, each of said cells being defined by an elongated compartment which is closed at least at one end by an oscillable lid element, a plurality of sensor elements, each sensor element being associable at a respective preset position of said rack to indicate depletion of the electronic components of a particular type in at least one of said containers in said rack, and electronic control circuit means driven by said sensor elements to indicate the depletion of said electronic components in said at least one container and actuate via opening means an opening oscillation of the oscillable lid element in a cell which accommodates tubular containers for electronic components of said one type, whereby the opened lid alerts an operator to manually remove the depleted container from the cell and refill the cell with a full container.

2. A magazine according to claim 1, having a substantially matrix-like configuration wherein said plurality of cells is arranged according to rows and columns of an essentially rectangular matrix.

3. A magazine according to claim 1, wherein each of said cells is constituted by a hollow elongated parallelepipedal body with essentially rectangular transverse cross section to contain said tubular containers, and each of said lids is constituted by an essentially rectangular plate-like element and is pivoted along one side at least at one open end face of said hollow body, said opening means including magnet means provided for each cell, said magnet means being driven by said electronic control circuit means for opening said lids upon control of said sensor elements.

4. A magazine according to claim 3, wherein said control circuit means comprise a control board for controlling said magnet means, said control board being driven by said sensor elements and comprising rows and columns selection circuit means driving said magnet means to selectively open the lid of a cell which contains tubular containers of said electronic components which the sensor means have sensed as depleted.

5. A magazine according to claim 3, wherein said magnet means comprise a substantially column-like magnetic winding supported between two end plates which are rigidly associated with a box-like profiled element having a substantially U-shaped transverse cross section.

6. A magazine according to claim 3, wherein each of said magnet means is rigidly associated with said hollow body of each of said cells and co-operates with a magnetic rod which is rigidly associated with the lid of each of said cells for an opening oscillation of said lid actuated by said electronic control circuit means.

7. A magazine according to claim 1, wherein said control circuit means comprise a sensor board which comprises, in a circuitally and operatively connected manner, at least one alarm drive module, multiplexing means, demultiplexing means and a plurality of said sensor elements which are connected to said demultiplexing means and can be scanned sequentially.

8. A magazine according to claim 1, wherein each of said sensor elements is constituted by a photodiode-phototransistor pair associated with each of said tubular containers in said rack so as to sense depletion of respective electronic components in each of said tubular containers.

* * * * *